US007358192B2

(12) United States Patent
Merry et al.

(10) Patent No.: US 7,358,192 B2
(45) Date of Patent: Apr. 15, 2008

(54) METHOD AND APPARATUS FOR IN-SITU FILM STACK PROCESSING

(75) Inventors: Walter R. Merry, Sunnyvale, CA (US); Quanyuan Shang, Saratoga, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 46 days.

(21) Appl. No.: 10/821,723

(22) Filed: Apr. 8, 2004

(65) Prior Publication Data
US 2005/0224181 A1 Oct. 13, 2005

(51) Int. Cl.
*H01L 21/02* (2006.01)
(52) U.S. Cl. .................. 438/706; 438/710; 216/58; 216/41; 216/67; 216/74; 216/75; 216/79; 156/345.35; 156/345.31
(58) Field of Classification Search ............ 438/707–9, 438/706; 156/345.11
See application file for complete search history.

(56) References Cited

U.S. PATENT DOCUMENTS

| 2,344,138 | A |   | 3/1944  | Drummond        |
|-----------|---|---|---------|-----------------|
| 3,109,100 | A |   | 10/1963 | Gecewicz        |
| 3,291,715 | A |   | 12/1966 | Anderson        |
| 4,431,898 | A |   | 2/1984  | Reinberg et al. |
| 4,778,561 | A |   | 10/1988 | Ghanbari        |
| 4,867,859 | A |   | 9/1989  | Harada et al.   |
| 4,871,431 | A |   | 10/1989 | Ogle et al.     |
| 4,948,458 | A |   | 8/1990  | Ogle            |
| 5,045,166 | A |   | 9/1991  | Bobblo          |
| 5,061,838 | A |   | 10/1991 | Lane et al.     |
| 5,105,761 | A |   | 4/1992  | Charlet et al.  |
| 5,106,827 | A |   | 4/1992  | Borden et al.   |
| 5,107,201 | A |   | 4/1992  | Ogle            |
| 5,277,751 | A |   | 1/1994  | Ogle            |
| 5,290,382 | A |   | 3/1994  | Zarowin et al.  |
| 5,435,881 | A |   | 7/1995  | Ogle            |
| 5,478,766 | A | * | 12/1995 | Park et al. .................. 438/158 |
| 5,505,780 | A |   | 4/1996  | Dalvie et al.   |
| 5,520,209 | A |   | 5/1996  | Goins et al.    |
| 5,542,559 | A |   | 8/1996  | Kawakami et al. |
| 5,569,363 | A |   | 10/1996 | Bayer et al.    |
| 5,682,517 | A |   | 10/1997 | Shan            |
| 5,770,982 | A |   | 6/1998  | Moore           |
| 5,788,778 | A |   | 8/1998  | Shang et al.    |
| 5,892,328 | A |   | 4/1999  | Shang et al.    |
| 5,895,548 | A |   | 4/1999  | Ettinger et al. |
| 5,897,752 | A |   | 4/1999  | Hong et al.     |
| 5,935,077 | A |   | 8/1999  | Ogle            |
| 5,948,168 | A |   | 9/1999  | Shan et al.     |
| 5,994,236 | A |   | 11/1999 | Ogle            |
| 5,994,942 | A |   | 11/1999 | Itoh            |
| 5,998,933 | A |   | 12/1999 | Shun'ko         |
| 6,024,044 | A |   | 2/2000  | Law et al.      |
| 6,041,735 | A |   | 3/2000  | Murzin et al.   |
| 6,055,927 | A |   | 5/2000  | Shang et al.    |
| 6,132,552 | A |   | 10/2000 | Donohoe et al.  |
| 6,150,628 | A |   | 11/2000 | Smith et al.    |
| 6,172,322 | B1 |  | 1/2001  | Shang et al.    |
| 6,203,657 | B1 |  | 3/2001  | Collison et al. |
| 6,239,553 | B1 |  | 5/2001  | Barnes et al.   |
| 6,260,894 | B1 | * | 7/2001 | Minnick et al. ............. 294/1.1 |
| 6,283,692 | B1 | * | 9/2001 | Perlov et al. .......... 414/222.01 |
| 6,418,874 | B1 |  | 7/2002  | Cox et al.      |
| 6,432,255 | B1 |  | 8/2002  | Sun et al.      |
| 6,440,753 | B1 | * | 8/2002 | Ning et al. .................... 438/3 |
| 6,440,864 | B1 | * | 8/2002 | Kropewnicki et al. ...... 438/710 |
| 6,468,601 | B1 |  | 10/2002 | Shang et al.    |
| 2001/0006070 | A1 | | 7/2001 | Shang et al.    |
| 2002/0007795 | A1 | | 1/2002 | Bailey, III. et al. |
| 2002/0132488 | A1 | * | 9/2002 | Nallan ........................ 438/720 |
| 2002/0179248 | A1 | * | 12/2002 | Kabansky .............. 156/345.36 |
| 2002/0192957 | A1 | * | 12/2002 | Chien et al. ................ 438/689 |

FOREIGN PATENT DOCUMENTS

| EP | 0 424 256 A1 | 4/1991 |
| EP | 0 546 852    | 6/1993 |
| EP | 0 823 218    | 4/1998 |
| WO | WO 99/00823  | 1/1999 |
| WO | WO 01/11650  | 2/2001 |
| WO | WO 03/012567 A1 | 2/2003 |

OTHER PUBLICATIONS

Wolf et al (vol. 1, Process Technology, 1986, Lattice Press, figure 5, pp. 546-547 & p. 432)).*
Van Zant (A Practicle Guide to Semiconductor Processing; Semiconductor Services; 1986; section 13.6, figure 13.6).*
Leverd et al. (Wsi/Poly-Si gate Stack etching for advanced dRAM applications (1999 IEEE/SEMI Advanced Semiconductor manufacturing Conference and Workshop; Sep. 8-10, 1999; Boston, MA, USA).*
Wolf et al (Silicon Processing for the VLSI Era; vol. 1; 1986; Lattice Press).*
Zhang et al., "A High Power Radio Frequency Transformer for Plasma Production in a Toroidal Plasma Source," *Rev. Sci. Instrum.*, 69(1), Jan. 1998, 101-108.
Partial International Search Report dated Apr. 26, 2006 for PCT/US2005/011319.
PCT International Search Report for PCT/US2005/011319, date of mailing, Jul. 13, 2006.

* cited by examiner

*Primary Examiner*—Duy-Vu N. Deo
*Assistant Examiner*—Patricia A. George
(74) *Attorney, Agent, or Firm*—Patterson & Sheridan, LLP

(57) ABSTRACT

Embodiments of a cluster tool, processing chamber and method for processing a film stack are provided. In one embodiment, a method for in-situ etching of silicon and metal layers of a film stack is provided that includes the steps of etching an upper metal layer of the film stack in a processing chamber to expose a portion of an underlying silicon layer, and etching a trench in the silicon layer without removing the substrate from the processing chamber. The invention is particularly useful for thin film transistor fabrication for flat panel displays.

31 Claims, 10 Drawing Sheets

METHOD AND APPARATUS FOR IN-SITU FILM STACK PROCESSING

BACKGROUND OF THE INVENTION

1. Field of the Invention

Embodiments of the invention generally relate to a method and apparatus for multilayer filmstack removal processing of metal and silicon materials in-situ. The invention is particularly useful for thin film transistor fabrication for flat panel displays.

2. Background of the Related Art

Substrate processing is typically performed by subjecting a substrate to a plurality of sequential processes to create devices, conductors and insulators on the substrate. Each of these processes is generally performed in a process chamber configured to perform a single step of the production process. A number of process chambers are typically coupled to a central transfer chamber that houses a robot to facilitate transfer of the substrate between the process chambers, thereby facilitating efficient completion of a sequence of processing steps in a processing platform. A processing platform having this configuration is generally known as a cluster tool, examples of which are the families of AKT PECVD, PRODUCER®, CENTURA® and ENDURA® processing platforms available from Applied Materials, Inc., of Santa Clara, Calif.

Generally, a cluster tool comprises a central transfer chamber having a robot disposed therein. The transfer chamber is generally surrounded by one or more process chambers. The process chambers are generally utilized to process substrates, for example, performing various processing steps such as etching, physical vapor deposition, ion implantation, lithography and the like. The transfer chamber is sometimes coupled to a factory interface that houses a plurality of removable substrate storage cassettes, each of which houses a plurality of substrates. A load lock chamber is disposed between the transfer chamber and the factory interface to facilitate transfer of a substrate between a vacuum environment of the transfer chamber and a generally ambient environment of the factory interface.

Glass substrates utilized in flat panel processing, such as those utilized to fabricate computer monitors, large screen televisions and displays for PDAs and cell phones and the like, are becoming dramatically larger as the demand for flat panels increases. For example, glass substrates utilized for flat panel fabrication have increased in area from 550 mm×650 mm to 1500 mm×1800 mm in just a few years, and are envisioned to exceed four (4) square meters in the near future.

Processing systems (e.g., cluster tools) have also increased in size to accommodate processing such large substrates. For example, the internal diameter of a transfer chamber utilized to move such large substrates between processing chambers in a typical cluster tool has increased from about 80 to about 135 inches to accommodate the substrate size. Thus, the cost associated with tooling configured to process large area substrates continues to escalate dramatically.

One structure typically formed on large area substrates is a transistor. In conventionally fabricated transistors, sequential process steps generally include metal and silicon etching, deposition, patterning and etching steps repeated multiple times. FIG. 14 is a flow diagram of an exemplary conventional transistor fabrication process. As the metal etching, silicon etching, and deposition processes are typically performed in separate cluster tools, the cost for fabricating transistors on large area substrates is high due to the number and size of tools, and the additional expense of transferring the substrate between tools during processing. Moreover, the number of substrate transfers between tools has an adverse effect on product yields due to the increase potential for contamination as the substrate is removed from the vacuum environment of one cluster tool for transfer to the next cluster tool required for the processing sequence. Thus, the continued utilization of multiple tools for transistor fabrication is undesirable, particularly in light of the significant investment by the manufacturer represented in each large area substrate.

Therefore, there is a need for an improved method and apparatus for multilayer film stack processing of substrates.

SUMMARY OF THE INVENTION

Embodiments of a cluster tool, processing chamber and method for in-situ processing of a substrate are provided. In one embodiment, a cluster tool includes at least one processing chamber suitable for in-situ etching of silicon and metal layers of a film stack, at least one residual removal station, and at least one coating station suitable for depositing a passivation layer on the etched film stack. In another embodiment, the same processing chamber is configured to perform both etch and deposition processes.

In another aspect of the invention, a processing chamber is provided suitable for in-situ etching of silicon and metal layers of a film stack. In yet another embodiment, the processing chamber includes a remote plasma source for exciting a first process gas prior to entry into the processing chamber while a second processing gas is delivered to the processing chamber bypassing the remote plasma source. RF power applied between a gas distribution plate and a substrate support generates and maintains a plasma formed from the gas mixture within the processing chamber.

In another embodiment, a method for in-situ ashing photoresist, etching of silicon, doped silicon and metal layers of a film stack is provided. The method includes the steps of etching an upper metal layer of the film stack in a processing chamber to expose a portion of an underlying silicon layer, and etching several hundred Angstroms into the silicon layer without removing the substrate from the processing chamber.

BRIEF DESCRIPTION OF THE DRAWINGS

So that the manner in which the above recited features of the present inventions are attained and can be understood in detail, a more particular description of the invention, briefly summarized above, may be had by reference to the embodiments thereof which are illustrated in the appended drawings.

It is to be noted, however, that the appended drawings illustrate only typical embodiments of the inventions and are therefore not to be considered limiting of its scope, for the inventions may admit to other equally effective embodiments.

DETAILED DESCRIPTION

Figure 1:
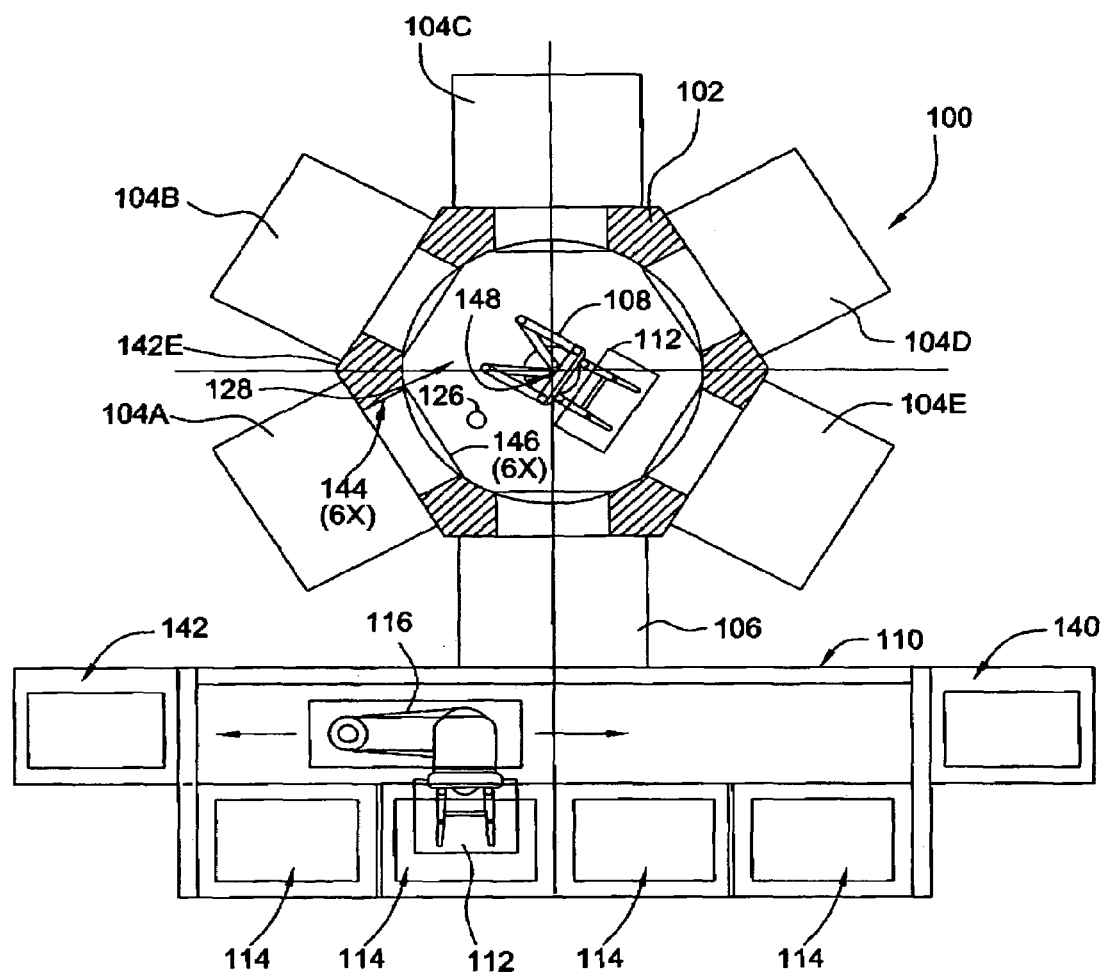
FIG. 1 is a plan view of one embodiment of a cluster tool configured for in-situ processing of a film stack.

FIG. 1 depicts one embodiment of a semiconductor processing system or cluster tool 100 configured for in-situ processing of film stacks (i.e., without removal of the substrate from the tool) comprising different materials formed on large area substrates (e.g., substrates having a device side surface area of at least 0.25 square meters). The exemplary processing tool 100 generally includes a transfer chamber 102 circumscribed by one or more processing chambers 104A-E, a factory interface 110, one or more load lock chambers 106 and a post etch residual removal station 142. The processing tool 100 may optionally include a coating station 140. In the embodiment depicted in FIG. 1, one load lock chamber 106 is disposed between the transfer chamber 102 and the factory interface 110 to facilitate substrate transfer between a vacuum environment maintained in the transfer chamber 102 and a substantially ambient environment maintained in the factory interface 110. A transfer robot 108 is centrally disposed in the transfer chamber 102 to move substrates between the chambers 104A-E, 106. One example of a processing system which may be adapted to benefit from the invention is a 25K PECVD processing system available from AKT, Inc., a division of Applied Materials, Inc., located in Santa Clara, Calif. Although a method and apparatus for in-situ etching of a film stack is described herein with reference to the exemplary processing tool 100, it is contemplated that the invention may be adapted and practiced in other processing systems having different configurations. For example, it is contemplated that the system 100 may be comprised of a plurality of processing regions within a single chamber.

The factory interface 110 generally houses one or more substrate storage cassettes 114, an interface robot 116, the post etch residue removal station 142 and the coating station 140. Each cassette 114 is configured to store a plurality of substrates 112 therein. The substrates 112 are typically formed of glass material suitable for the manufacture of flat panel displays, computer monitors, large screen televisions and displays for PDAs and cell phones and the like. The interface robot 116 is generally configured to move substrates between the cassettes 114, the post etch residue removal station 142 and the transfer chamber 102. The factory interface 110 is generally maintained at or near atmospheric pressure. In one embodiment, filtered air is supplied to the factory interface 110 to minimize the concentration of particles within the factory interface 110 and correspondingly enhance substrate cleanliness.

Figure 2A:
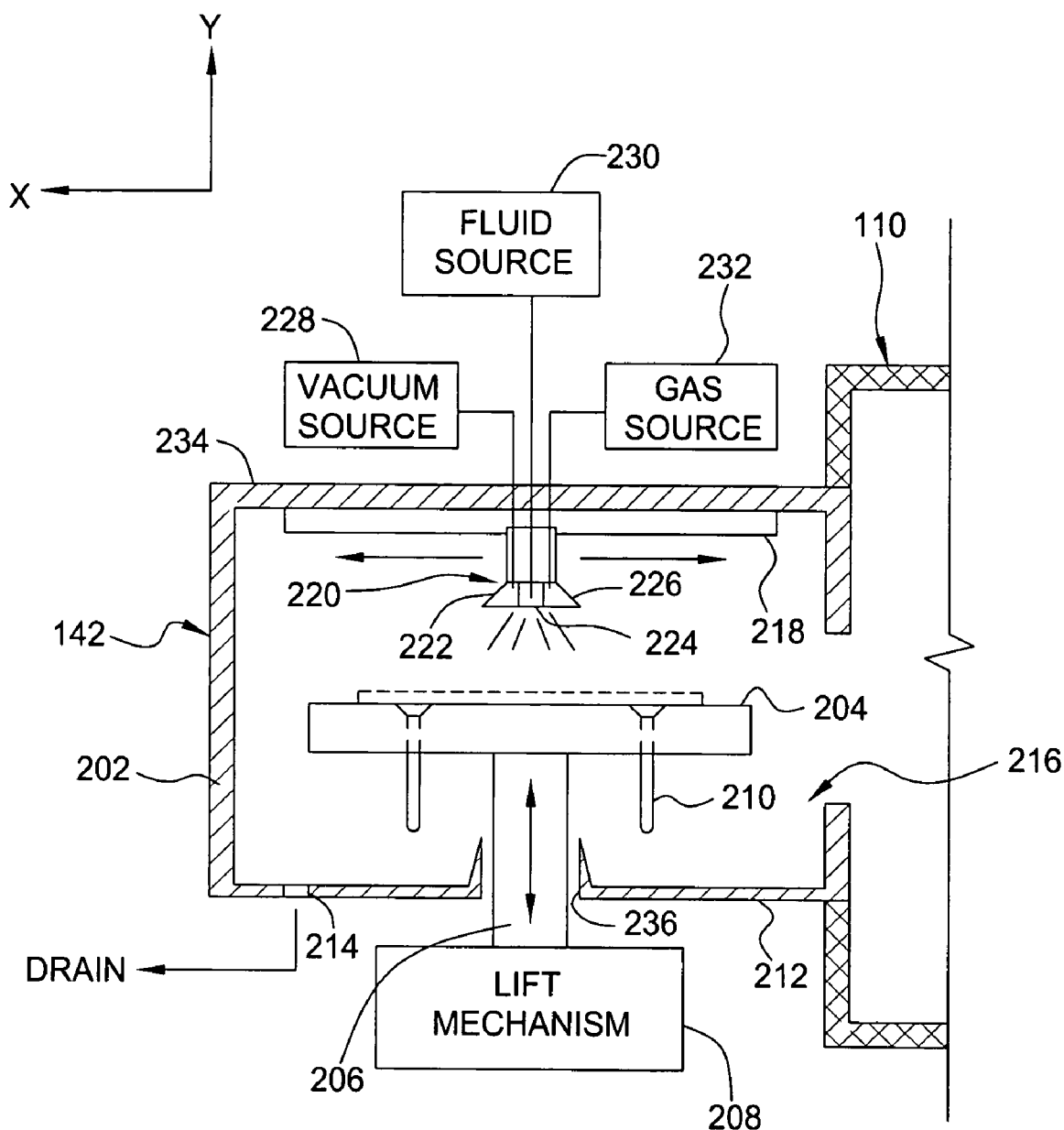
FIG. 2A is a sectional view of one embodiment of an etch residual removal station.

FIG. 2A depicts one embodiment of the post etch residue removal station 142. The post etch residue removal station 142 generally prepares the substrate for deposition after etching by removing contaminants, residues and unwanted material from the substrate.

In the embodiment depicted in FIG. 2A, the post etch residual removal station 142 includes a substrate support 204 disposed within a chamber body 202, having a process head 220 movable thereover. The chamber body 202 is typically fabricated from aluminum or other suitable material. The chamber body 202 is generally coupled to the factory interface 110, and includes a passage 216 for allowing the interface robot 116 (shown in FIG. 1) to place and retrieve substrates from the substrate support 204.

The substrate support 204 is coupled by a shaft 206 to a lift mechanism 208. The shaft passes through an aperture 236 formed in a bottom 212 of the chamber body 202. The lift mechanism 208 allows the substrate support 204 to be moved to an upper position proximate the head 220 for processing and a lower position to facilitate substrate transfer. In the lower position (not shown) lift pins 210 disposed through the substrate support 204 impinge upon the bottom 212 of the chamber body 202, thereby causing the substrate to become spaced apart from the substrate support 204 as the substrate support 204 is lowered, thereby allowing access to the substrate by the interface robot 116.

The processing head 220 is generally coupled to a top 234 of the chamber body 202 by a motion device 218. The motion device 218 is configured to scan the head over the entire upper surface of a substrate disposed on the substrate support 204. The motion device may be any robot or x/z positioning device suitable for moving the head laterally over the upper facing side of the substrate 112 retained by the substrate support 204.

The processing head 220 generally includes a vacuum nozzle 222, a spray nozzle 224 and a gas delivery nozzle 226. The spray nozzle 224 is coupled to a fluid source 230. The spray nozzle 224 is adapted to direct a stream of fluid suitable for removing etch residual material from the etch process from the substrate. In one embodiment, the fluid source 230 provides deionized water to the spray nozzle 224.

The vacuum and gas delivery nozzles 222, 226 are utilized to remove the cleaning fluid after the substrate is cleaned. In one embodiment, the vacuum nozzle 222 is coupled to a vacuum source 228 that sucks cleaning fluid from the substrate surface after the cleaning cycle. The gas delivery nozzle 226 is coupled to a gas source 232 that provides an inert gas to the substrate surface to assist in cleaning and drying the substrate. In one embodiment, the inert gas is nitrogen.

Figure 2B:
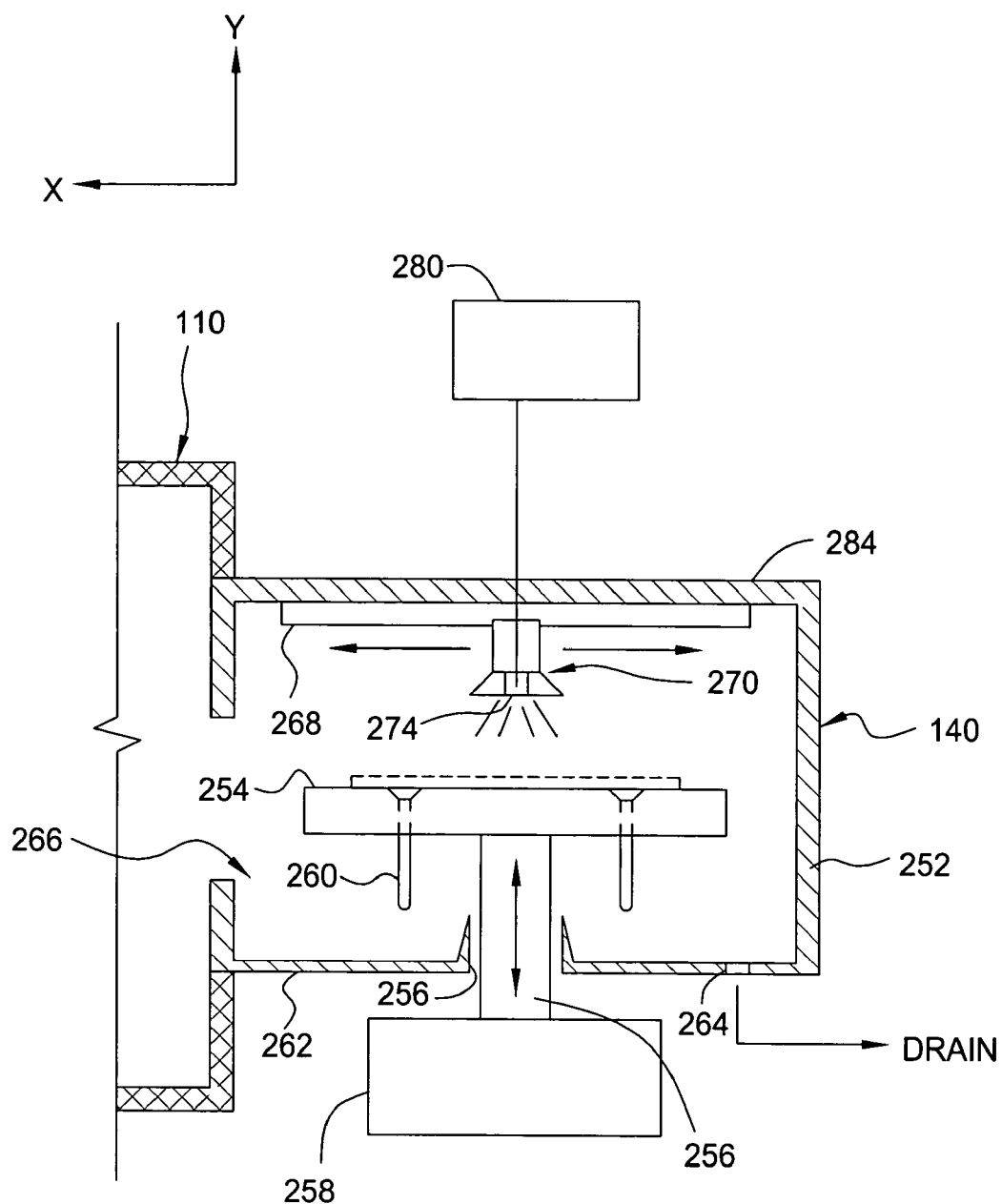
FIG. 2B is a sectional view of one embodiment of a coating station.

FIG. 2B depicts one embodiment of the coating station 140. The coating station 140 is generally configured to apply an organic film for passivating the filmstack after etching.

In the embodiment depicted in FIG. 2B, the coating station 140 includes a substrate support 254 disposed within a chamber body 252, having a process head 270 movable thereover. The chamber body 252 is typically fabricated from aluminum or other suitable material. The chamber body 252 is generally coupled to the factory interface 110, and includes a passage 266 for allowing the interface robot 116 (shown in FIG. 1) to place and retrieve substrates from the substrate support 254.

The substrate support 254 is coupled by a shaft 256 to a lift mechanism 258. The shaft 256 passes through an aperture 286 formed in a bottom 262 of the chamber body 252. The lift mechanism 258 allows the substrate support 254 to be moved to an upper position proximate the head 270 for processing and a lower position to facilitate substrate transfer. In the lower position (not shown) lift pins 260 disposed through the substrate support 254 impinge upon the bottom 262 of the chamber body 252, thereby causing the substrate to become spaced apart from the substrate support 254 as the substrate support 254 is lowered, thereby allowing access to the substrate by the interface robot 116.

The lift mechanism 258, or other mechanism, may optionally be configured rotate the substrate support 254. For example, the lift mechanism 258 may include a rotary actuator or motor (not shown) coupled to the shaft 256 to rotate the substrate during coating.

The processing head 270 is generally coupled to a top 284 of the chamber body 252 by a motion device 268. The motion device 268 is configured to scan the head over the entire upper surface of a substrate disposed on the substrate support 254. The motion device may be any robot or x/z positioning device suitable for moving the head laterally over the upper facing side of the substrate 112 retained by the substrate support 254.

The processing head 270 generally includes a spray nozzle 274. The spray nozzle 274 is coupled to a fluid source 280. The spray nozzle 274 is adapted to direct a stream of fluid suitable for coating the etched structure formed on the substrate with a passivation coating, for example, an organic film. The scanning motion provided to the processing head 270, optionally coupled with the rotating substrate, allows the coating to be applied uniformly over the substrate.

Returning to FIG. 1, the transfer chamber 102 is fabricated from a structural material suitable for use with process and/or cleaning chemistries, for example, an aluminum or steel alloy. In one embodiment, the transfer chamber 102 is fabricated from a single piece of aluminum alloy. The transfer chamber 102 defines an evacuable interior volume 128 through which substrates are transferred between the processing chambers 104A-E coupled to the exterior of the transfer chamber 102. A pumping system (not shown) is coupled to the transfer chamber 102 through a vacuum port 126 disposed on the chamber floor to maintain vacuum within the transfer chamber 102. In one embodiment, the pumping system Includes a roughing pump coupled in tandem to a turbomolecular or a cryogenic pump.

The transfer chamber 102 includes a plurality of facets for mounting the various processing and load lock chambers 104A-E, 106 thereto. A passage 144 is formed through each facet coupling the respective chambers 104A-E, 106 to the interior volume 128 of the transfer chamber 102. Each passage 144 is selectively sealed by a slit valve 146 that is movable between a closed position that isolates the chamber environments and an open position that facilitates substrate transfer between the chambers 104, 106. Each processing chamber 104 is typically bolted to one of the facets on the exterior of the transfer chamber 102.

The load lock chamber 106 is generally coupled between the factory interface 110 and the transfer chamber 102. The load lock chamber 106 is generally used to facilitate transfer of the substrates 112 between the vacuum environment of the transfer chamber 102 and the substantially ambient environment of the factory interface 110 without loss of vacuum within the transfer chamber 102. Each side of the load lock chamber 106 includes a substrate transfer passage that is selectively sealed by one of the slit valves 146 (shown only on the transfer chamber side of the load lock chamber 106) to selectively isolate the interior of the load lock chamber 106 from the transfer chamber 106 and the factory interface 110.

The substrate transfer robot 108 is generally disposed in the interior volume 128 of the transfer chamber 102 to facilitate transfer of the substrates 112 between the various chambers circumscribing the transfer chamber 102. The transfer robot 108 may include one or more blades utilized to support the substrate 112 during transfer. The transfer robot 108 may have two blades, each coupled to an independently controllable motor (known as a dual blade robot) or have two blades coupled to the transfer robot 108 through a common linkage.

It is contemplated that at least one of the processing chambers 104A-E may be configured to thermally process or heat one or more substrates disposed thereon. One suitable thermal process chamber is described in U.S. patent application Ser. No. 10/025,152, filed Dec. 18, 2001, by Shang, et al., and is hereby incorporated by reference in its entirety. In another embodiment, the substrate can be preheated in loadlock during pump down before entering the process chamber.

Figure 3:
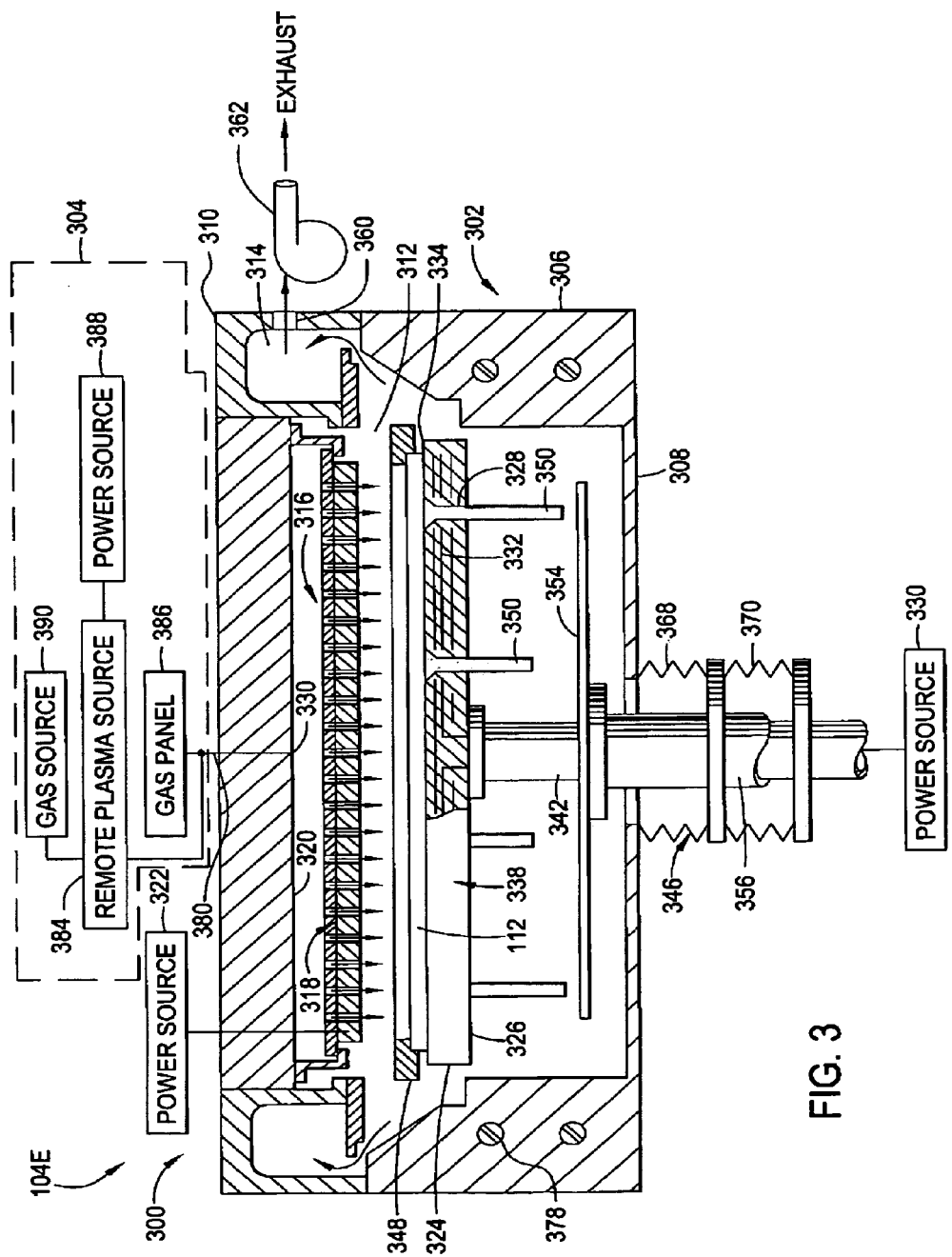
FIG. 3 is a sectional view of one embodiment of a processing chamber.

FIG. 3 is a cross sectional view of one embodiment of processing chamber 104E, which is configured as a plasma enhanced processing chamber 300. The processing chamber 300 may be configured to perform etching and/or chemical vapor deposition processes.

The chamber 300 generally includes a chamber body 302 coupled to a gas delivery system 304. The chamber body 302 has walls 306 and a bottom 308 that partially define a process volume 312. The process volume 312 is typically accessed through a port (not shown) formed in the walls 306 that facilitates movement of a substrate 112 into and out of the chamber body 302 through the passage 144 of the transfer chamber 102. The walls 306 and bottom 308 may be fabricated from a unitary block of aluminum or other material compatible for processing.

The chamber body 302 may be thermally regulated. For example, the walls 306 and/or other portion of the chamber body 302 may by heated and/or cooled by a thermal control system. In the embodiment depicted in FIG. 3, the thermal control system is shown as one or more cartridge heaters 378 embedded in the walls 306 of the chamber body 302. The cartridge heaters 378 may alternatively be coupled to the exterior of the walls 306. It is also contemplated that other temperature control devices/systems may be utilized to the control the temperature of the chamber body 302. For example, one or more conduits may be formed in or attached to the chamber body 302 for flowing a heat transfer fluid. Other examples of devices suitable for controlling the temperature of the chamber body 302 include radiant heaters and resistive heaters, among others.

The walls 306 support a lid assembly 310 that contains a pumping plenum 314 that couples the process volume 312 to an exhaust port 360 (that includes various pumping components, not shown). The pumping plenum 314 is coupled through the exhaust port 360 to a pumping system 362. The pumping plenum 314 is utilized to channel gases and processing by-products uniformly from the process volume 312 and out of the chamber body 302. It is contemplated that one or more exhaust ports may be alternatively disposed in another portion of the processing chamber, for example through the chamber walls 306 or bottom 308, with or without use of a pumping plenum. For low pressure applications, one or more turbo dry pump may be used to achieve the required process pressure.

A temperature controlled substrate support assembly 338 is centrally disposed within the chamber body 302. The substrate support assembly 338 supports the substrate 112 during processing. In one embodiment, the substrate support assembly 338 comprises an aluminum body 324 that encapsulates at least one embedded heater 332.

The heater 332, such as resistive element, disposed in the substrate support assembly 338, is coupled to a power source 330 and controllably heats the substrate support assembly 338 and the substrate 112 positioned thereon to a predetermined temperature. For example, in a CVD process, the heater 332 maintains the substrate 112 at a uniform temperature between about 350 to at least about 460 degrees Celsius, depending on the deposition processing parameters for a material being depositing on the substrate 112. In another example, in an etch process, the heater 332 maintains the substrate 112 at a uniform temperature between about 60 to at least about 180 degrees Celsius, depending on the etching parameters for a material being removed from the substrate 112.

Generally, the substrate support assembly 338 has a lower side 326 and an upper side 334. The upper side 334 supports the substrate 112. The lower side 326 has a stem 342 coupled thereto. The stem 342 couples the substrate support assembly 338 to a lift system (not shown) that moves the substrate support assembly 338 between an elevated processing position (as shown) and a lowered position that facilitates substrate transfer to and from the chamber body 302. The stem 342 additionally provides a conduit for electrical and thermocouple leads between the substrate support assembly 338 and other components of the processing chamber 300.

A bellows 346 is coupled between support assembly 338 (and/or the stem 342) and the bottom 308 of the chamber body 302. The bellows 346 provides a vacuum seal between the chamber volume 312 and the atmosphere outside the chamber body 302 while facilitating vertical movement of the substrate support assembly 338.

The substrate support assembly 338 generally is grounded such that RF power supplied by a power source 322 to a gas distribution plate assembly 318 positioned between the lid assembly 310 and substrate support assembly 338 (or other electrode positioned within or near the lid assembly of the chamber) may excite gases present in the process volume 312 between the substrate support assembly 338 and the distribution plate assembly 318. The distribution plate assembly 318 generally has a central gas permeable section disposed over an area of at least 0.25 square meters to promote uniform flow of gas towards the substrate. The RF power from the power source 322 is generally selected commensurate with the size of the substrate to drive the chemical vapor deposition and/or etch process. Generally, the power source 322 is suitable for providing about 1,000 to about 30,000 Watts at a frequency of about 13.56 mHz to the gas distribution plate assembly 318. A matching circuit (not shown) is provided between the power source 322 and the gas distribution plate assembly 318 to efficiently couple power therebetween. It is contemplated that greater power requirements may be required to process larger substrates in the future. Alternatively, the power can be applied from bottom substrate support plate. In this case, the ground will be made on the gas distribution plate. In another embodiment, both the bottom substrate support plate and the showerhead may be powered. In yet another embodiment, RF power may be provided in more than one frequency.

The substrate support assembly 338 additionally supports an optional circumscribing shadow frame 348. Generally, the shadow frame 348 prevents deposition at the edge of the substrate 112 and support assembly 338 so that the substrate does not stick to the substrate support assembly 338 when deposition processes are being performed.

The substrate support assembly 338 has a plurality of holes 328 disposed therethrough that accept a plurality of lift pins 350. The lift pins 350 are typically comprised of ceramic or anodized aluminum. Generally, the lift pins 350 have first ends that are substantially flush with or slightly recessed from the upper side 334 of the substrate support assembly 338 when the lift pins 350 are in a normal position (i.e., retracted relative to the substrate support assembly 338). The first ends are typically flared to prevent the lift pins 350 from falling through the holes 328. Additionally, the lift pins 350 have a second end that extends beyond the lower side 326 of the substrate support assembly 338. The lift pins 350 may be actuated relative to the substrate support assembly 338 by a lift plate 354 to project from the support surface 330, thereby placing the substrate in a spaced-apart relation to the substrate support assembly 338.

The lift plate 354 is disposed between the lower side 326 of the substrate support assembly 338 and the bottom 308 of the chamber body 302. The lift plate 354 is connected to an actuator (not shown) by a collar 356 that circumscribes a portion of the stem 342. The bellows 346 includes an upper portion 368 and a lower portion 370 that allows the stem 342 and collar 356 to move independently while maintaining the isolation of the process volume 312 from the environment exterior to the chamber body 302. Generally, the lift plate 354 is actuated to cause the lift pins 350 to extend from the upper side 334 as the substrate support assembly 338 and the lift plate 354 move closer together relative to one another.

The lid assembly 310 provides an upper boundary to the process volume 312. The lid assembly 310 typically can be removed or opened to service the chamber body 302. In one embodiment, the lid assembly 310 is fabricated from aluminum.

The lid assembly 310 typically includes an entry port 330 through which process gases provided by the gas delivery system 304 are introduced into the chamber body 302. The gas delivery system 304 includes central gas delivery line 380 coupled at a first end to the entry port 380 and teed at a second end between a remote plasma source 384 and a gas panel 386.

Optionally, a cleaning agent, such as oxygen and/or dissassociated fluorine, may be provided through the central gas delivery line 380 to the chamber body 302 to remove deposition byproducts and films from processing chamber hardware. The cleaning agent may be provided from at least one of the remote plasma source 384, the gas source 386 or other source not shown.

Optionally, an etching ending point monitoring device can be attached to the chamber to monitor the processing progress. Ending point monitoring can be optical emission, IR sensing composition, and interferometer to determine the thickness.

The remote plasma source 384 utilizes plasma to generate radicals of a first process gas remotely from the chamber 300, thereby isolating the substrate 112 from the high energy and temperature associated with radical generation and preventing damage to devices formed on the substrate 112. Moreover, the remote plasma source 384 allows greater process flexibility by facilitating higher processing temperatures within the chamber, thereby allowing processes to be performed on substrates having photoresist and other low temperature layers disposed thereon that conventional higher temperature processes would destroy, alter, damage and/or remove.

The remote plasma source 384 is coupled to a gas source 390 and a power source 388. The gas source 390 generally provides a reactive gas which is excited and/or disassociated within the remote plasma source 384 prior to delivery of the process volume 312. Examples of some gases provided by the gas source 390 include at least one or more of $Cl_2$, $BCl_3$, $SF_6$, $F_2$, $NF_3$ and $C_xF_y$ and their mixture with $O_2$ and $N_2$, He, Ar among others. It is contemplated that other gases may be utilized for processing different material layers on the substrate. The power source 388 generally couples about 1 to 30 kilowatts of RF or microwave power to the remote plasma source 388 to excite and/or disassociate process gas provided by the gas source 390.

The gas distribution plate assembly 318 is coupled to an interior side 320 of the lid assembly 310. The gas distribution plate assembly 318 is typically configured to substantially follow the profile of the substrate 112, for example, polygonal for large area substrates and circular for wafers. The gas distribution plate assembly 318 includes a perforated area 316 through which process and other gases supplied from the gas delivery system 304 are provided to the process volume 312. The perforated area 316 of the gas distribution plate assembly 318 is configured to provide uniform distribution of gases passing through the gas distribution plate assembly 318 into the chamber body 302. Examples of gas distribution plates that may be adapted to benefit from the invention are described in U.S. patent application Ser. No. 09/922,219, filed Aug. 8, 2001 by Keller et al., and U.S. patent application Ser. No. 10/337,483, filed n. 7, 2003, by Blonigan et al., both of which are hereby incorporated by reference in their entireties.

Figure 4:
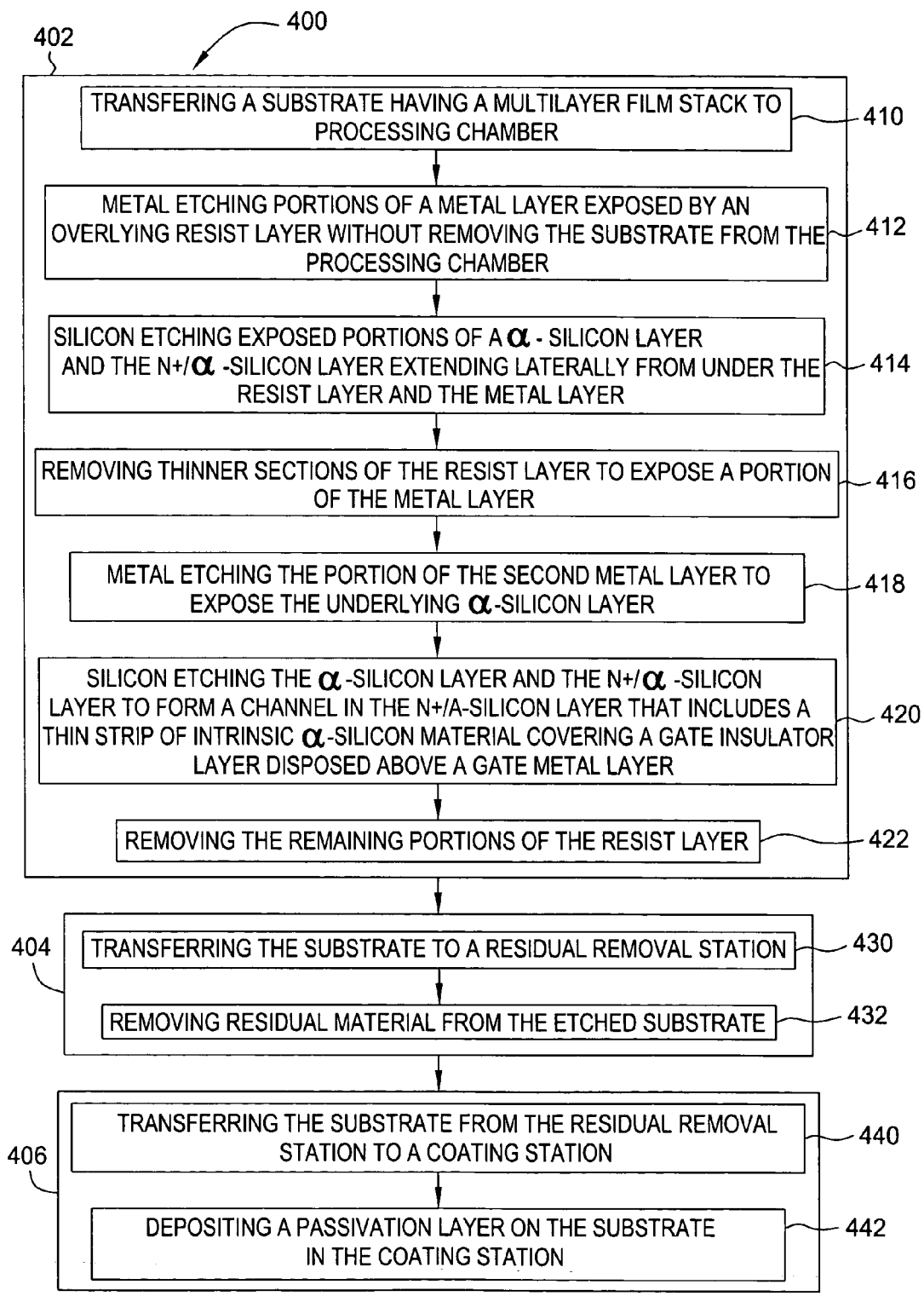
FIG. 4 depicts a flow diagram of one embodiment of a method for in-situ processing of a film stack that may be practiced in the cluster tool of FIG. 1.

FIG. 4 is a flow diagram of a method 400 of processing a film stack in the cluster tool 100. The method 400 includes at least a method of etching 402 a film stack in-situ the processing chamber 300 (i.e., without removal of the substrate from the chamber 300), and may optionally include a step 404 of removing etch residues in-situ the tool 100 (i.e., without removal of the substrate from the tool 100) and passivating the etched film stack in-situ the tool 100 (i.e., without removal of the substrate from the chamber 300 and/or the tool 100) at step 406. The method 400 is best described with reference to sequential schematic diagrams of a film stack 500A-I depicted in FIGS. 5-13 corresponding to various stages of the method 400. The ranges of power and flow of gas delivered in the method 400 described below are suitable for processing a 1.2 m ×1.5 m substrate. It is contemplated that additional power levels and gas flow rates may be required for processing small or larger substrates. It is also contemplated that it may be desirable to maintain the temperature of the chamber body 306 substantially equal to the temperature of the substrate during processing.

It is contemplated that the exemplary method 400 is but one method that may be practiced within the processing chamber 300. For example, in-situ etching of at least two different layers is contemplated, where the layers are selected from the group consisting of metal, amorphous silicon, N+silicon, silicon and passivation nitride.

Figure 5:
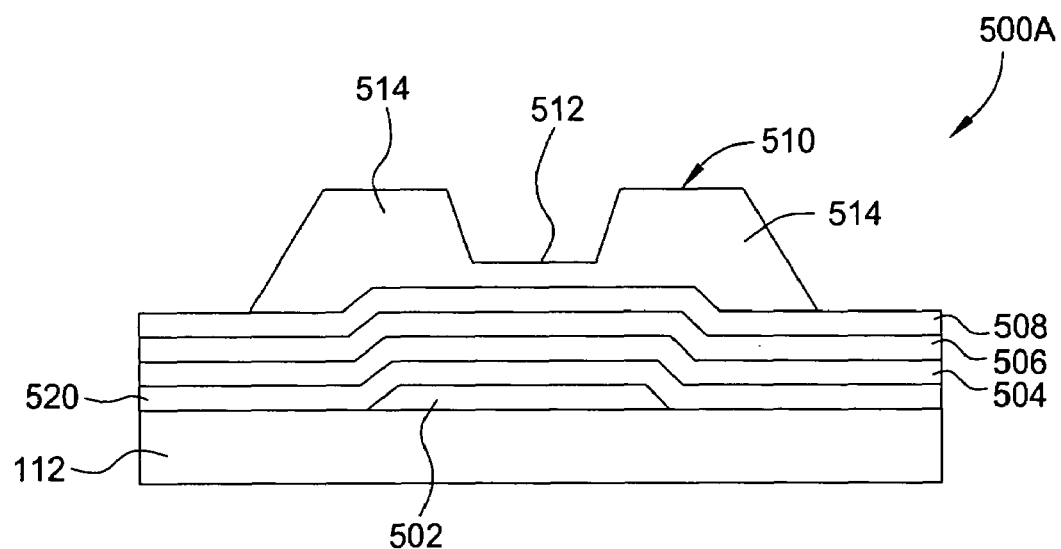
FIGS. 5-13 depict a film stack in various processing stages of the method depicted in the flow diagram of FIG. 4.

FIG. 5 depicts one embodiment of the film stack 500A disposed on the glass substrate 112. The film stack 500 includes a gate metal layer 502 disposed between a gate insulation layer 520 and the glass substrate 112. A semiconductive layer is disposed over the gate insulation layer 520. In one embodiment, the semiconductive layer includes one or mare silicon layers. In the embodiment depicted in FIG. 5, the semiconductive layer is an amorphous silicon (a-silicon) layer 504 disposed over the gate insulation layer 520 and a N+/a-silicon layer 506 is disposed on the a-silicon layer 504. A second metal layer 508 is disposed on the N+/a-silicon layer 506. A patterned photoresist (resist) layer 510 is disposed on a portion of the second metal layer 508 overlying the gate metal layer 502. The photoresist layer 510 includes a thinner section 512 substantially centered over the gate metal layer 502 disposed between thicker sections 514. This type of film stack is used for 4-mask processing. One method for 4-mask processing is described by C.W. Kim et al., SID 200 Digest, paper no. 42.1, p. 1006 (2000). This invention intends to completes all the etching steps in one chamber. Materials suitable for the gate metal layer 502 include aluminum, aluminum alloys, chromium, molybdenum, titanium, and combinations thereof. Materials suitable for the gate insulation layer 520 include dielectric materials, such as SiN, $SiO_x$, among others. In one embodiment, the gate insulation layer 520 Is $SIN_x$. The subscript X, as used herein, represents a positive integer. Materials suitable for the second metal layer 508 include aluminum, aluminum alloys, chromium, molybdenum, titanium, and combinations thereof.

The method 400 begins at step 410 when the substrate 112 having the film stack 500A disposed thereon is transferred from one of the cassettes 114 to the processing chamber 300. Once in the processing chamber 300, the method of etching 402 the film stack 500A begins by etching exposed portions of the second metal layer 508 at step 412.

Figure 6:
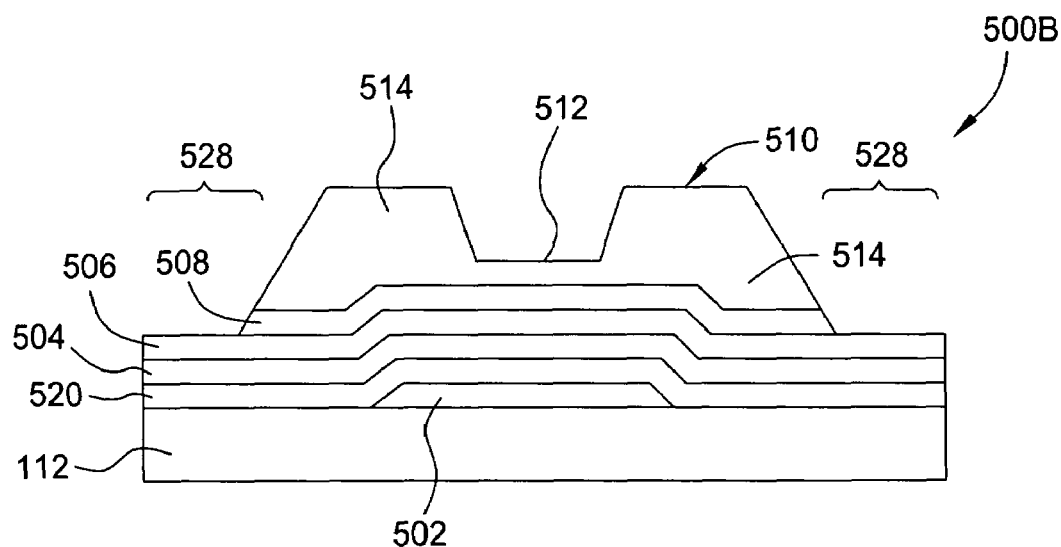

In one embodiment, the second metal layer 508 is etched in the chamber 300 by providing 0-5000 sccm of $BCI_3$ and 50-500 sccm of chlorine comprising gas, such as $CI_2$/HCI. Optionally, $O_2$ and/or He may also be provided to the processing chamber 300 at flow rates between 50-500 sccm. The $BCI_3$ is first excited in the remote plasma source 384 by coupling about 1-30 kWatts of power thereto. A plasma is formed from the gas mixture within the chamber 300 by applying about 5-30 kWatts of RF power to the gas distribution plate assembly 318. The bias power additionally provides activation energy to etch the second metal layer 508. The metal etch step 412 is generally selective to the N+/α-silicon layer 506, which may be used as an etch stop. In one embodiment, step 412 includes delivering about 1000 sccm of $BCI_3$ to the remote plasma source 384, energizing the $BCI_3$ with about 5 kWatts of power, delivering about 2000 sccm of $CI_2$/HCI to the processing chamber 300, and biasing the gas distribution plate assembly with about 10 kWatts of RF power. Step 412 is generally performed at a pressure between about 10-500 mTorr and at a substrate temperature of about 100±60 degrees Celsius. The metal etch step 412 produces a film stack 500B that is depicted in FIG. 6. The use of the remote plasma source 384 to active, excite and/or dissociate at least portion of the process gases allows for higher processing temperatures, which, in concert with the capacitive power applied between the gas distribution plate assembly and substrate support, thereby allow the film stack to be efficiently etched with reduced temperature excursion due to plasma heating.

Figure 7:
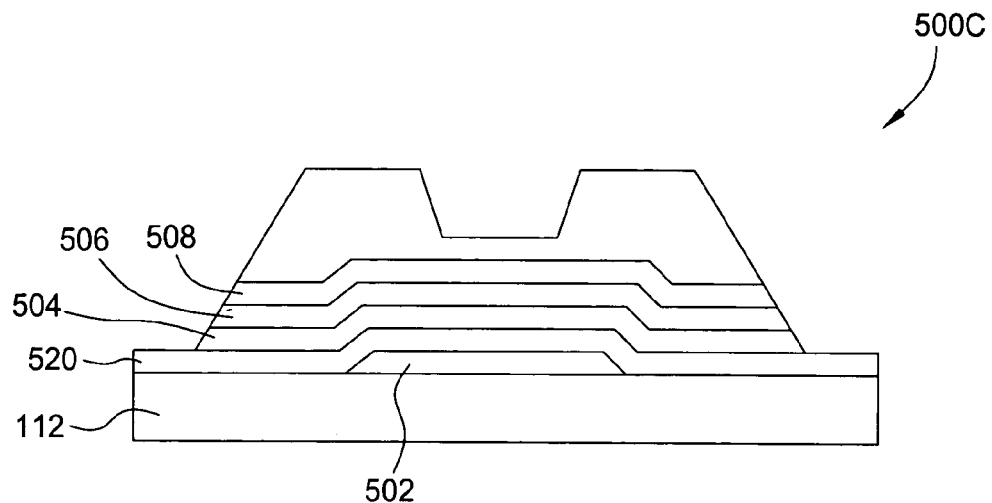

After completion of the etch step 412, a silicon etching step 414 is performed on the film stack 500B without removing the substrate 112 from the chamber 300. The silicon etching step 414 removes exposed portions 528 of the a-silicon layer 504 and the N+/a-silicon layer 506 extending laterally from under the photoresist layer 510 and second metal layer 508. The silicon etch step 414 produces a film stack 500C that is depicted in FIG. 7.

In one embodiment, the a-silicon layer 504 and the N+/a-silicon layer 506 are etched in the chamber 300 by providing fluorine comprising gas and about 500-10,000 sccm of $O_2$ to the processing chamber 300. The fluorine comprising gas may be excited and/or disassociated in the remote plasma source 384. In one embodiment, about 50-2,000 sccm of $SF_6$ is provided by the gas source 390 and disassociated into fluorine radicals by coupling about 5-30 kWatts to the $SF_6$ gas in the remote plasma source 384. A plasma from the gas mixture within the chamber 300 is formed by applying about 5-30 kWatts of RF power to the gas distribution plate assembly 318. The bias power additionally provides activation energy to etch the silicon layers 504, 506. The silicon etch step 414 is generally selective to the dielectric layer 520, which may be used as an etch stop. Alternatively $NF_3$ may be utilized to replace $SF_6$ in any of the silicon etching steps In one embodiment, step 414 includes delivering about 500 sccm of $SF_6$ to the remote plasma source 384, energizing the $SF_6$ with about 10 kWatts of power, delivering about 1000 sccm of $O_2$ to the processing chamber 300, and biasing the gas distribution plate assembly with about 5 kWatts of RF power. Step 414 is generally performed between about 10-500 mTorr and at a substrate temperature of about 100±60 degrees Celsius.

Following the silicon etching step 414, a partial ashing step 416 is performed in the chamber 300 on the film stack 500C. The partial ashing step 416 removes the thinner section 512 of the photoresist layer 510 to expose a portion 530 of the second metal layer 508 between the thicker sections 514 of the photoresist. In one embodiment, the thinner section 512 of the photoresist is removed by ashing to expose a portion 530 of the underlying second metal layer 508.

Figure 8:
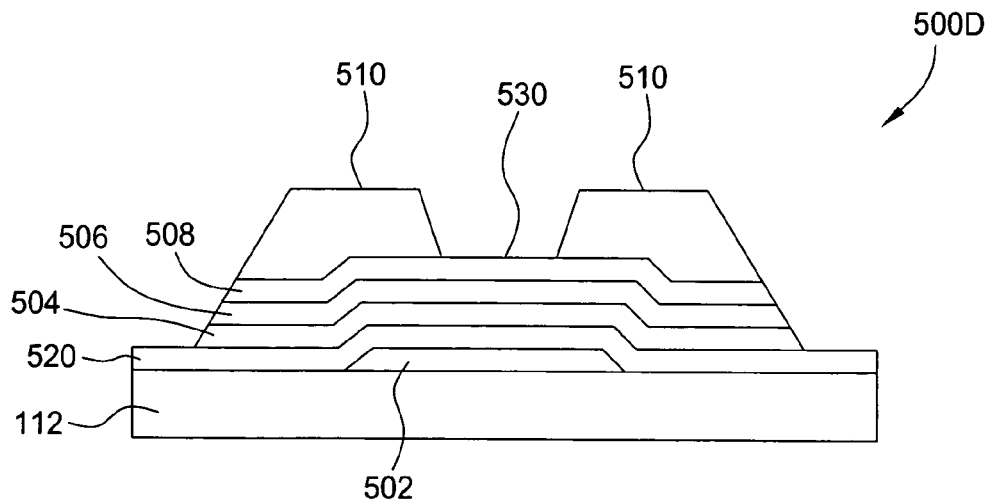

One example of a suitable ashing process comprises providing between about 500-10,000 sccm of $O_2$ to the processing chamber 300 from the gas source 386. $N_2$ may additionally be provided to the processing chamber. A plasma from the $O_2$ within the chamber 300 by applying about 5-30 kWatts of RF power to the gas distribution plate assembly 318. The ashing step 416 is stopped when the underlying second metal layer portion 530 is exposed. In one embodiment, step 416 includes delivering about 4000 sccm of $O_2$ to the processing chamber 300, and biasing the gas distribution plate assembly with about 10 kWatts of RF power. Step 414 is generally performed at a pressure between about 10-1,000 mTorr and a substrate temperature of about 100±60degrees Celsius. The partial ashing step 416 produces a film stack 500D that is depicted in FIG. 8.

Figure 9:
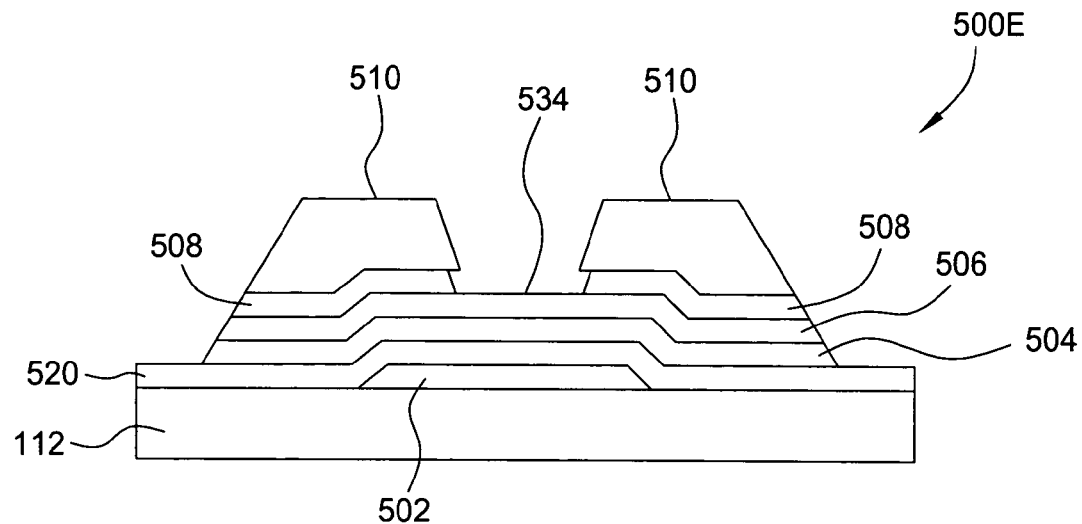

The exposed second metal layer portion 530 of the film stack 500D is etched at step 418 in the chamber 300. The metal etching step 418 exposes a portion 534 of the underlying a-silicon layer 504. In one embodiment, the metal etch step 418 is substantially identical to the process parameters of step 412. The metal etching step 418 produces a film stack 500E that is depicted in FIG. 9.

Figure 10:
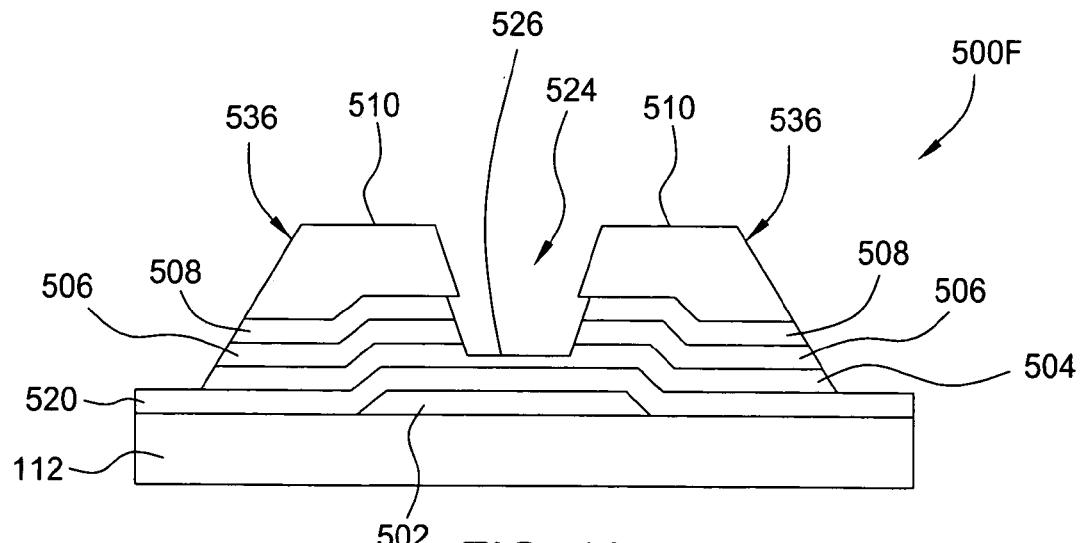

At step 420, the a-silicon layer 504 and the N+/a-silicon layer 506 of the film stack 500E are etched in the chamber 300. The silicon etch step 420 breaks completely through the N+/a-silicon layer 506 and partially through the silicon layer 504, thus forming a channel 524 in the a-silicon layer 504. The channel 524 includes a thin strip 526 of a-silicon material covering the gate insulator layer 520 above the gate metal layer 502. The silicon etching step 420 produces a film stack 500F that is depicted in FIG. 10. In one embodiment, the silicon etching step 420 is substantially identical to the process parameters of step 414.

At this stage, there may be overhang of top layer metal over N+ silicon layer. Optionally, another second metal etch step may be performed as described above to trim back the overhang to create a smooth taper.

Figure 11:
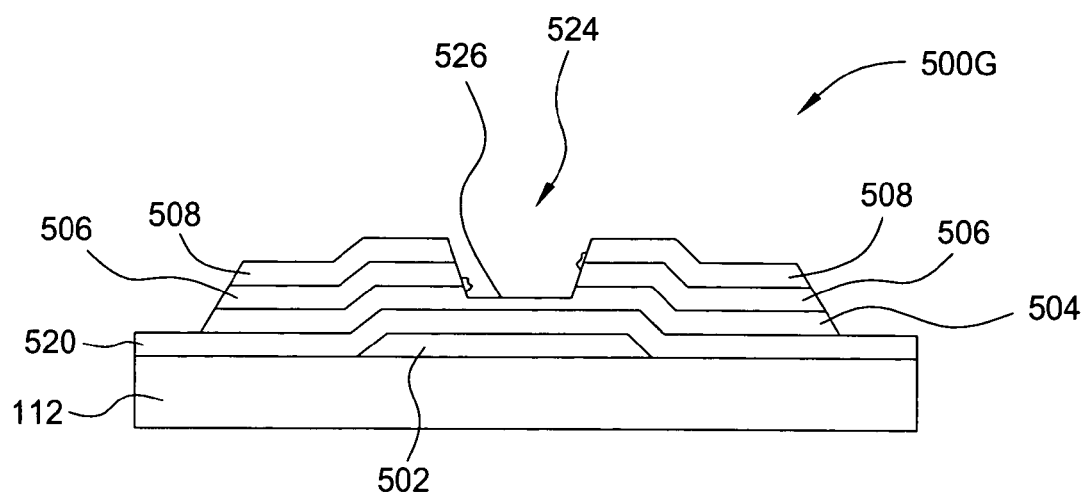

Remaining portions 536 of the photoresist layer 510 shown in the film stack 500F are removed from the second metal layer 508 at step 422. In one embodiment, step 422 is performed in the chamber 300 to remove the photoresist layer 510 using process parameters substantially identical to the parameters of step 416. Alternatively, the remaining portions 536 of the photoresist layer 510 may be removed by ashing or other suitable processes in another one of the processing chambers coupled to the cluster tool 100. The photoresist removal step 420 produces a film stack 500G that is depicted in FIG. 11.

The etched substrate containing the film stack 500G further processed at step 404 to remove residual material from the etch step 402. The residual removal step 404 includes a step 430 of transferring the film stack 500G to the residual removal station 142 for processing at a removal step 432. In the embodiment depicted in FIG. 1, the etched substrate remains in-situ the tool 100, by passing the etch substrate through the load lock chamber 106 to the residual removal station 142 disposed in the factory interface 110. Optionally, the residual removal station 142 may alternatively be located in other locations within the tool, or optionally, at a location remote from the tool 100 within the FAB. In processes where the etch step 402 leaves substantially no residues, step 404 may be bypassed.

Figure 12:
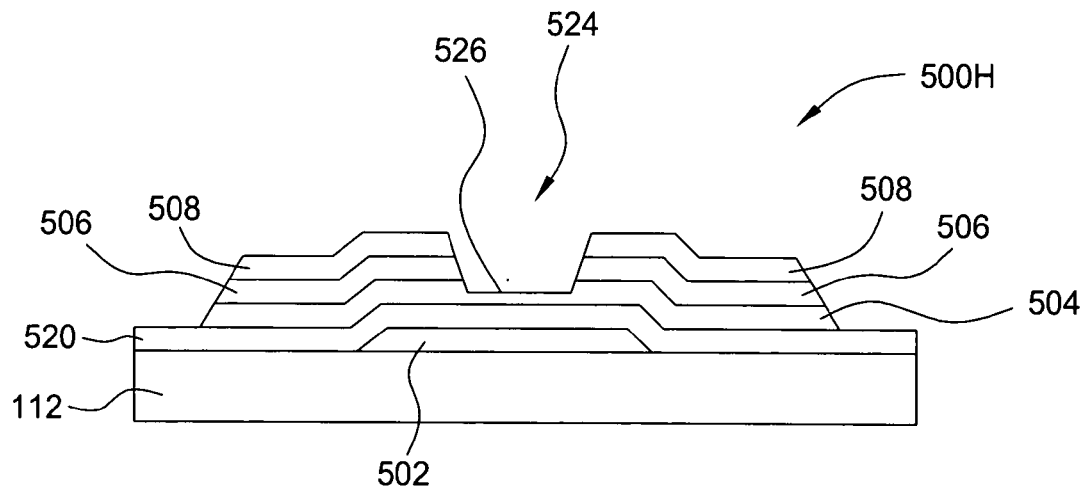

In one embodiment, the step 432 of removing residual material from the etched substrate 112 comprises rinsing the substrate by flowing de-ionized water over the substrate to remove the residual material, vacuuming off de-ionized water left from the rinsing step, and blowing nitrogen onto the substrate to assist in removing wafer left from the rinsing step. It is contemplated that residual material may be removed by other processes. The residual removal step 432 produces a film stack 500H that is depicted in FIG. 12.

Figure 13:
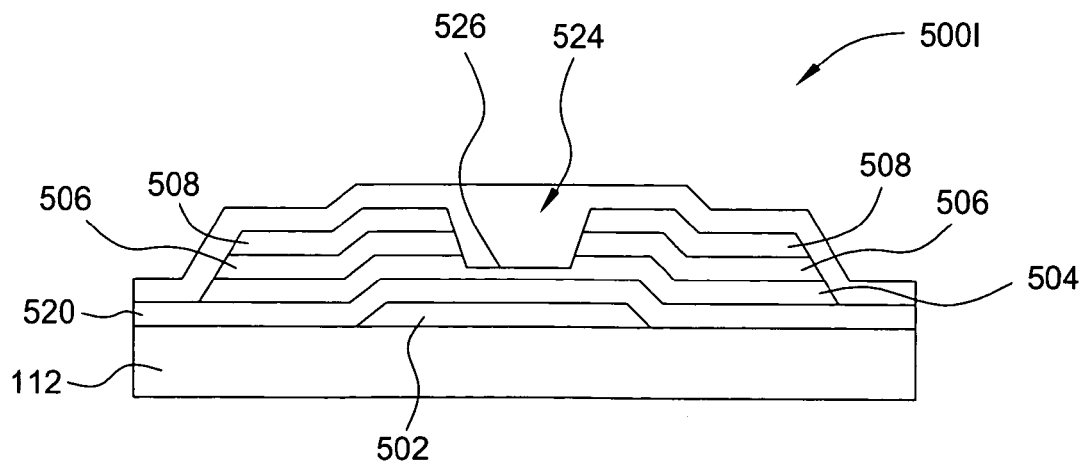
Figure 14:
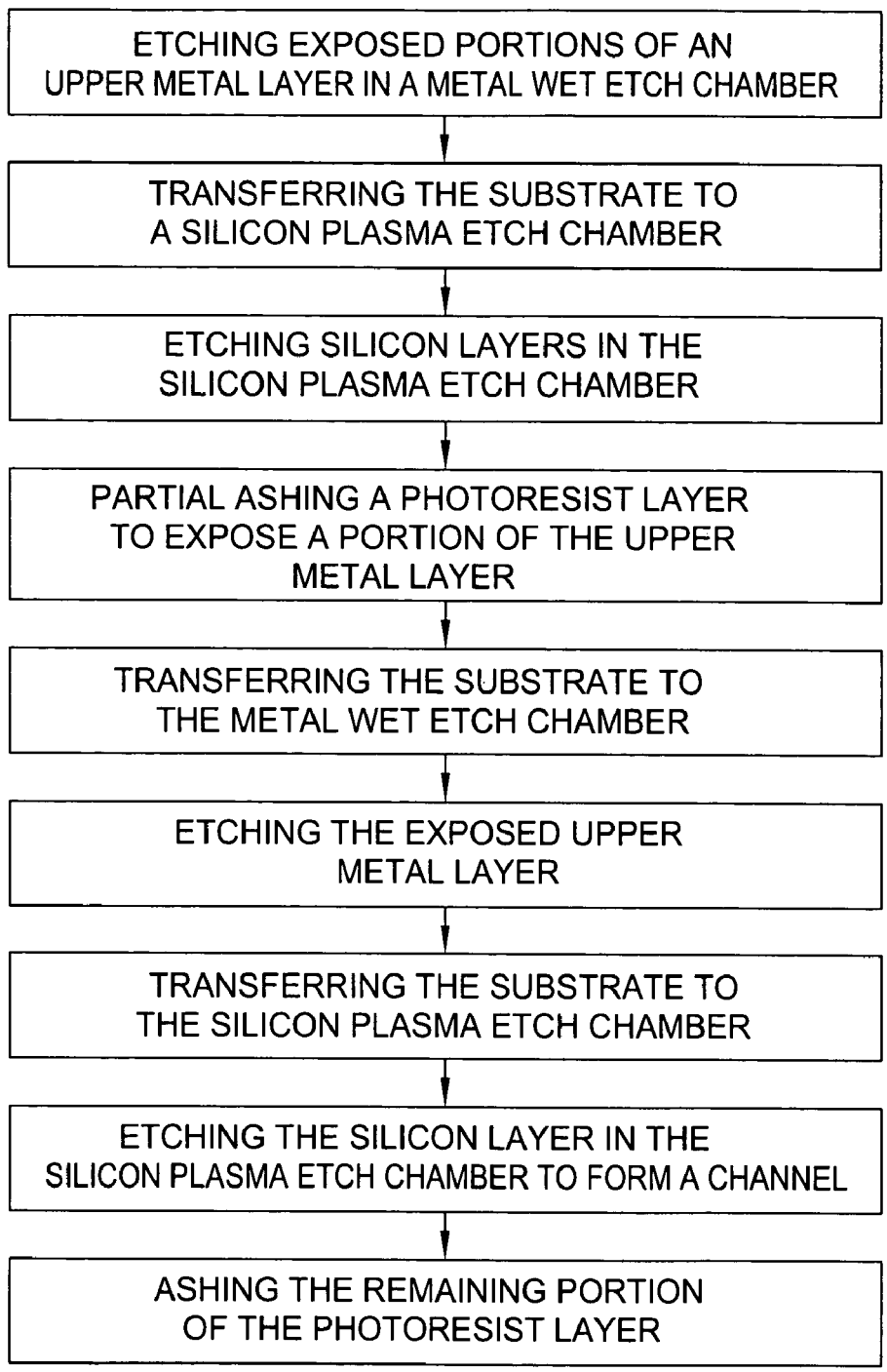
FIG. 14 is a flow diagram of an exemplary conventional transistor fabrication process.

After step 404, the cleaned substrate having the film stack 500H is passivated at step 406. The passivation step 406 includes a step 440 in which the substrate is transferred to the coating station 140 for a deposition step 442. It is contemplated that the processing chamber 300 (and/or another one of the processing chambers coupled to the tool 100) may be configured for deposition and utilized as an alternative to the coating station 140. The deposition step 442 generally provides a passivation layer 540 comprised of a dielectric material over the film stack 500H. Materials suitable for use as the passivation layer 540 include nitrides, SiN and organic films, among others. In one embodiment, the passivation layer 540 is comprised of $SiN_x$ applied in the processing chamber 300. In another embodiment, the the passivation layer 540 is comprised of $SiN_x$ applied in the coating station 140. The deposition step 442 produces a film stack 500I that is depicted in FIG. 13.

In one embodiment, the deposition step 442 includes providing silane ($SiH_4$) (100 to 500 sccm) and ammonia ($NH_3$) (500 to 2000 sccm) in a carrier gas of nitrogen (1000 to 20,000 sccm) from the gas panel to the processing chamber 300. The processing chamber is maintained at a pressure between about 0.8-2.0 Torr. The temperature of the substrate 112 is maintained at about 300 to at least about 350 degrees Celsius during deposition. The gas distribution plate assembly 318 is biased with RF power to form a plasma from the gas mixture within the chamber 300. This process results in a deposition rate of about 2000-3000 angstroms/min of silicon nitride. Other suitable deposition processes are available from AKT, Inc., a division of Applied Materials, Inc., located in Santa Clara, Calif.

Other films which may be etched in discrete processes using the remote excitation of the process gas as described above include undoped amorphous silicon, N+ amorphous silicon, silicon nitride (PECVD or other type), chromium, molybdenum, aluminum (commercially pure or alloyed, for example, with at least one of Si, Nd or Cu) and titanium. Both undoped amorphous silicon and + amorphous silicon may be etched with a gas mixture of $O_2$ and $NF_3$ or a gas mixture of $O_2$ and $SF_6$. Either mixture may optionally include $Cl_2$. Silicon nitride may be etched with a gas mixture of $O_2$ and $NF_3$, a gas mixture of $O_2$ and $SF_6$, a gas mixture of $O_2$ and $CHF_3$, or a gas mixture of $O_2$ and other $C_xH_yF_z$ gas, including $C_xF_z$. Chromium may be etched with a gas mixture of $O_2$ and $Cl_2$. Molybdenum may be etched with $Cl_2$, a gas mixture of $O_2$ and $Cl_2$, a gas mixture of $O_2$ and $NF_3$ or a gas mixture of $O_2$ and $SF_6$. Aluminum and titanium may be etched with a gas mixture of $Cl_2$ and $BCL_3$ or a gas mixture of $Cl_2$ and $SiCL_4$.

Thus, various embodiments of a cluster tool and method for processing a multilayer film stack have been provided. Advantageously, a film stack may be processed to fabricate a transistor structure without leaving the cluster tool, thereby significantly reducing the number of tools and FAB footprint and utility requirements as compared to transistor structures conventionally form by sequential processing on multiply individual tools. Moreover, as low temperature etching of both metal and silicon layers may be performed in-situ a single processing chamber, the fabrication time and tooling requirements are also significantly reduced as compared to conventionally processed substrates.

While the foregoing is directed to the preferred embodiment of the present invention, other and further embodiments of the invention may be devised without departing from the basic scope thereof, and the scope thereof is determined by the claims that follow.

What is claimed is:

1. A method for a processing film stack formed on a substrate, the film stack having at least a patterned photoresist layer having a thinner portion formed between thicker sections and disposed over an first metal layer, a first silicon layer underlying the first metal layer, a second silicon layer underlying the first silicon layer, and a second metal layer disposed between the second silicon layer and the substrate, wherein the thinner sections of the patterned photoresist layer is over the second metal layer, wherein the thickness difference between the thin and thick section is sufficient to leave the thicker section of the photoresist layer after the thinner section is removed by an ashing process, the method comprising:
   etching a portion of the first metal layer in a processing chamber exposed by the patterned photoresist layer to expose a portion of the first silicon layer; and
   etching the exposed portion of the first silicon layer in the processing chamber.

2. The method of claim 1 further comprising:
   etching in the processing chamber a portion of the second silicon layer exposed by the etching of the first silicon layer.

3. The method of claim 2 further comprising:
   exposing a portion of the first metal layer through the photoresist.

4. The method of claim 3, wherein the step of exposing the portion of the first metal layer through the photoresist further comprises:
   ashing a portion of the photoresist.

5. The method of claim 3, wherein the step of exposing the portion of the first metal layer through the photoresist further comprises:
   removing the thinner section of photoresist disposed between the thicker sections of photoresist.

6. The method of claim 3 further comprising:
   etching the portion of the first metal layer exposed through the photoresist to expose a second portion of the first silicon layer.

7. The method of claim 6 further comprising:
   etching through the second portion of the first silicon layer to expose a second portion of the second silicon layer; and
   etching a channel in the second silicon layer.

8. The method of claim 6, wherein the step of etching the channel further comprises:
   leaving a strip of the second silicon layer between the channel and the second metal layer.

9. The method of claim 4, wherein the step of ashing is performed in the processing chamber.

10. The method of claim 1, wherein the step of etching the first metal layer further comprises:
    providing a first process gas energized by a remote plasma source to the processing chamber; and
    providing a second process gas to the processing chamber.

11. The method of claim 10, wherein the step of etching the first metal layer further comprises:
    biasing the gases provided to the processing chamber with an RF power source.

12. The method of claim 11, wherein the step of biasing further comprises:
    applying RF power to at least one of a gas distribution plate or a substrate support disposed in the chamber body.

13. The method of claim 10, wherein the first process gas is $BCl_3$ and the second process gas is a chlorine comprising gas.

14. The method of claim 1, wherein the step of etching the first silicon layer further comprises:
    providing a first process gas energized by a remote plasma source to the processing chamber; and
    providing a second process gas to the processing chamber.

15. The method of claim 14, wherein the step of etching the first silicon layer further comprises:
    biasing the gases provided to the processing chamber with an RF power source.

16. The method of claim 15, wherein the step of biasing further comprises:
    applying RF power to at least one of a gas distribution plate or a substrate support disposed in the chamber body.

17. The method of claim 14, wherein the first process gas is $SF_6$ and the second process gas is $O_2$.

18. The method of claim 14, wherein the first process gas is $NF_3$ and the second process gas is $O_2$.

19. The method of claim 7 further comprising:
    removing the photoresist from the film stack by ashing; and
    removing etch residues from the ashed filmstack.

20. The method of claim 19, wherein the step of removing etch residues further comprises:
    transferring the substrate to another processing station within a cluster tool having the processing chamber coupled thereto.

21. The method of claim 19 further comprising:
    deposing a passivation layer on the ashed film stack after residue removal.

22. The method of claim 21, wherein the step of depositing further comprises:
    transferring the substrate to a deposition chamber within a cluster tool having the processing chamber coupled thereto.

23. The method of claim 21, wherein the step of depositing further comprises:
    depositing the passivation layer in the processing chamber wherein the film stack was etched.

24. The method of claim 19, wherein the step of ashing occurs in the processing chamber.

25. The method of claim 19, wherein the step of removing etch residues further comprises:
    transferring the substrate to a residual removal station coupled to a factory interface.

26. The method of claim 25 further comprising:
depositing a passivation layer in a station coupled to the factory interface.

27. A method in-situ etching of silicon and metal layers of a film stack, comprising:
etching an upper metal layer of the film stack in a processing chamber to expose a portion of an underlying silicon layer; and
etching a trench in the silicon layer without removing the substrate from the processing chamber.

28. The method of claim 27, wherein the step of etching the upper metal layer and the silicon layer further comprises:
using a photoresist mask to pattern the etching.

29. The method of claim 27 further comprising:
ashing a photoresist layer disposed on the first metal layer without removing the substrate from a cluster tool having the processing chamber coupled thereto.

30. The method of claim 29 further comprising:
removing etch residues from the substrate without removing the substrate from the cluster tool.

31. The method of claim 25 further comprising:
depositing a dielectric material on the substrate without removing the substrate from the cluster tool.

* * * * *

UNITED STATES PATENT AND TRADEMARK OFFICE
CERTIFICATE OF CORRECTION

PATENT NO. : 7,358,192 B2  Page 1 of 1
APPLICATION NO. : 10/821723
DATED : April 15, 2008
INVENTOR(S) : Merry et al.

It is certified that error appears in the above-identified patent and that said Letters Patent is hereby corrected as shown below:

Title page, item [56]
In the References Cited:

Please delete "5,045,166 A 9/1991 Bobblo" and insert
--5,045,166 A 9/1991 Bobbio-- therefor;

In the Detailed Description:

Column 5, Line 31, please delete "Includes" and insert --includes--;

Column 8, Line 31, please delete "dissassociated" and insert --disassociated--.

Signed and Sealed this

Twenty-third Day of September, 2008

JON W. DUDAS
*Director of the United States Patent and Trademark Office*